(12) United States Patent
Shao et al.

(10) Patent No.: US 11,107,747 B2
(45) Date of Patent: Aug. 31, 2021

(54) SEMICONDUCTOR PACKAGE WITH COMPOSITE THERMAL INTERFACE MATERIAL STRUCTURE AND METHOD OF FORMING THE SAME

(71) Applicant: Taiwan Semiconductor Manufacturing Co., Ltd., Hsinchu (TW)

(72) Inventors: Tung-Liang Shao, Hsinchu (TW); Jen-Yu Wang, Hsinchu (TW); Chung-Jung Wu, Hsinchu (TW); Chih-Hang Tung, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/419,672

(22) Filed: May 22, 2019

(65) Prior Publication Data

US 2020/0091034 A1    Mar. 19, 2020

Related U.S. Application Data

(60) Provisional application No. 62/733,151, filed on Sep. 19, 2018.

(51) Int. Cl.
*H01L 23/42* (2006.01)
*H01L 23/00* (2006.01)
*H01L 23/31* (2006.01)
*H01L 21/56* (2006.01)
*H01L 25/18* (2006.01)

(52) U.S. Cl.
CPC ............ *H01L 23/42* (2013.01); *H01L 21/563* (2013.01); *H01L 23/315* (2013.01); *H01L 23/3128* (2013.01); *H01L 24/17* (2013.01); *H01L 24/33* (2013.01); *H01L 24/73* (2013.01); *H01L 25/18* (2013.01); *H01L 2224/0401* (2013.01); *H01L 2224/73253* (2013.01); *H01L 2924/1431* (2013.01); *H01L 2924/1434* (2013.01)

(58) Field of Classification Search
CPC ..... H01L 23/42; H01L 23/563; H01L 23/315; H01L 21/563; H01L 24/17; H01L 24/33; H01L 24/73; H01L 25/18
See application file for complete search history.

(56) References Cited

U.S. PATENT DOCUMENTS

2007/0045819 A1*  3/2007  Edwards ................. H01L 23/04
                                                                257/704
2007/0231953 A1* 10/2007  Tomita ................ H01L 23/3675
                                                                438/106

(Continued)

*Primary Examiner* — Nathan W Ha
(74) *Attorney, Agent, or Firm* — Birch, Stewart, Kolasch & Birch, LLP

(57) ABSTRACT

A semiconductor package is provided. The semiconductor package includes a substrate and a semiconductor die over the substrate. A heat-dissipating feature covers the substrate and the semiconductor die, and a composite thermal interface material (TIM) structure is thermally bonded between the semiconductor die and the heat-dissipating feature. The composite TIM structure includes a metal-containing matrix material layer and polymer particles embedded in the metal-containing matrix material layer.

20 Claims, 9 Drawing Sheets

(56) References Cited

U.S. PATENT DOCUMENTS

| | | | |
|---|---|---|---|
| 2008/0001268 A1* | 1/2008 | Lu | H01L 23/3675 257/678 |
| 2008/0111234 A1* | 5/2008 | Hua | H01L 23/367 257/713 |
| 2008/0298024 A1* | 12/2008 | Takashima | H01L 23/42 361/718 |
| 2009/0001557 A1* | 1/2009 | Renavikar | H01L 23/42 257/712 |
| 2009/0059537 A1* | 3/2009 | MacQuarrie | H01L 23/3675 361/711 |
| 2009/0298235 A1* | 12/2009 | Kostiew | H01L 21/50 438/118 |
| 2010/0327432 A1* | 12/2010 | Sirinorakul | H01L 23/4334 257/712 |
| 2011/0096507 A1* | 4/2011 | Deram | H01L 23/42 361/718 |
| 2011/0278715 A1* | 11/2011 | Ihara | H01L 23/055 257/712 |
| 2012/0119346 A1* | 5/2012 | Im | H01L 23/552 257/690 |
| 2013/0119527 A1* | 5/2013 | Luo | H01L 23/3736 257/690 |
| 2014/0138854 A1* | 5/2014 | Arora | H01L 23/3737 257/782 |
| 2014/0264818 A1* | 9/2014 | Lowe, Jr. | H01L 23/3736 257/712 |
| 2014/0264820 A1* | 9/2014 | Hu | H01L 23/3736 257/713 |
| 2015/0279761 A1* | 10/2015 | Bet-Shliemoun | H01L 23/42 257/714 |
| 2016/0329261 A1* | 11/2016 | Hung | H01L 23/433 |
| 2016/0363656 A1* | 12/2016 | Angelsen | B32B 5/16 |
| 2017/0154702 A1* | 6/2017 | Kwon | C08L 75/04 |
| 2017/0362449 A1* | 12/2017 | Malic | C09D 11/10 |
| 2017/0369766 A1* | 12/2017 | Johnson | C09K 8/588 |
| 2018/0350712 A1* | 12/2018 | Thanu | H01L 23/3675 |
| 2019/0113791 A1* | 4/2019 | Yamamoto | G02F 1/1333 |
| 2019/0131620 A1* | 5/2019 | Bartling | H01M 4/8657 |
| 2019/0214328 A1* | 7/2019 | Eid | H01L 23/4334 |
| 2019/0237383 A1* | 8/2019 | Saunders | H01L 23/40 |
| 2019/0295952 A1* | 9/2019 | Sikka | H01L 23/5385 |
| 2019/0326192 A1* | 10/2019 | Eid | H01L 25/0655 |
| 2019/0357386 A1* | 11/2019 | Coppola | H05K 7/20927 |
| 2020/0211729 A1* | 7/2020 | Chandrasekaran | H01L 31/022425 |

* cited by examiner

SEMICONDUCTOR PACKAGE WITH COMPOSITE THERMAL INTERFACE MATERIAL STRUCTURE AND METHOD OF FORMING THE SAME

PRIORITY CLAIM AND CROSS-REFERENCE

This Application claims the benefit of U.S. Provisional Application No. 62/733,151, filed on Sep. 19, 2018, and entitled "Semiconductor package with composite thermal interface material and method of forming the same", the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. The demand for smaller electronic devices has also grown recently, and therefore a need has grown for smaller and more creative packaging techniques for semiconductor dies. As the packaging density of microelectronic devices increases thanks to technological developments, manufacturers are continually shrinking the sizes of microelectronic devices to satisfy increasing demand for smaller electronic devices. Another trend in modern microelectronic devices is the increasing use of higher power consumption circuits. In order to accommodate the more densely packaged microelectronic devices with higher power consumption, the heat dissipation properties of the packaging of integrated circuits needs to be improved.

In the packaging of integrated circuits, one or more semiconductor dies may be bonded to a heat spreader (which is sometimes referred to as a heat sink) for heat dissipation. However, heat dissipation is a challenge in semiconductor packaging. A bottleneck may hamper the efficient dissipation of heat generated in the inner chips of the semiconductor package.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
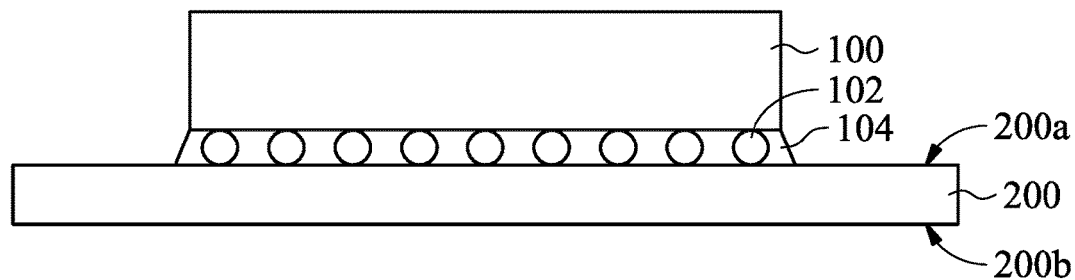
FIGS. 1A to 1E show cross-sectional representations of various stages of forming a semiconductor package, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

A semiconductor package with improved heat-dissipating ability and the method of forming the same are provided in accordance with various exemplary embodiments. The intermediate stages of forming the semiconductor package are illustrated. The variations of the embodiments are discussed. Throughout the various views and illustrative embodiments, like reference numbers are used to designate like elements.

The formation of the semiconductor package includes forming a composite thermal interface material (TIM) structure between the heat-dissipating feature (e.g., a heat spreader lid) and one or more semiconductor dies. The composite TIM structure includes a metal-containing matrix material layer. The composite TIM structure also includes polymer particles that are coated with a metal cover, respectively, and embedded in the metal-containing matrix material layer. The metal-containing matrix material layer provides good thermal conductivity, so that the heat generated by the semiconductor dies can be effectively transferred to the heat-dissipating feature. The polymer particle coated with the metal cover provides a stress buffer for the semiconductor dies and a mechanical support for the composite TIM structure. As a result, the semiconductor dies can be prevented from cracking during the thermal process, or such cracking can at least be mitigated. Moreover, the composite TIM structure can achieve a uniform thickness after the thermal process, so as to reduce the thermal resistance between the semiconductor die and the heat-dissipating feature.

FIGS. 1A to 1E show cross-sectional representations of various stages of forming a semiconductor package, in accordance with some embodiments. A substrate 200 having two opposite surfaces 200a and 200b is provided, as shown in FIG. 1A in accordance with some embodiments. In some embodiments, the substrate 200 is also referred to as a package component, such as a package substrate, an interposer, a printed circuit board (PCB), or the like. In some embodiments, the package component (i.e., the substrate 200) is a package substrate including an insulating layer and one or more patterned conductive layers serving as conductive traces and disposed at various levels of the insulating layer. A combination of the insulating layer with the patterned conductive layers form a redistribution layer (RDL) structure (which is also referred to as a fan-out structure) in the substrate 200.

In some embodiments, the insulating layer of the substrate 200 is formed of organic materials (such as polymer base materials), non-organic materials (such as silicon nitride, silicon oxide), or high-k dielectric material, or the like. In some embodiments, those patterned conductive layers in the substrate 200 are made of metal. In order to simplify the diagram, only a flat substrate is depicted. In some embodiments, discrete passive devices (not shown) such as resistors, capacitors, transformers, and the like, are also be bonded to at least one of opposite sides of the substrate 200.

A semiconductor die 100 is provided and mounted onto the upper surface 200a of the substrate 200, as shown in FIG. 1A in accordance with some embodiments. In some embodiments, the semiconductor die 100 includes conductive connectors 102 (such as metal bumps, solder balls, or the like). The semiconductor die 100 is bonded to the substrate 200 by a flip chip bonding process using the conductive connectors 102, so that the semiconductor die 100 is electrically connected to the substrate 200 via the conductive connectors 102. In some embodiments, the semiconductor die 100 is a system-on-chip (SoC) die, such as a logic die. For example, the logic die may be a central processing unit (CPU), a graphics processing unit (GPU), a memory controller, or the like.

In some embodiments, after the semiconductor die 100 is stacked on the substrate 200, a reflow process is performed on the conductive connectors 102, so that the semiconductor die 100 is mounted onto the substrate 200. In some embodiments, an optional underfill material 104, such as epoxy resin, is filled in the gap between the semiconductor die 100 and the substrate 200 thereby encapsulating the conductive connectors 102. The underfill material 104 provides mechanical support, electrical isolation of the joining members (i.e., conductive connectors 102), and protection of the active circuitry from the environment.

Figure 1B:
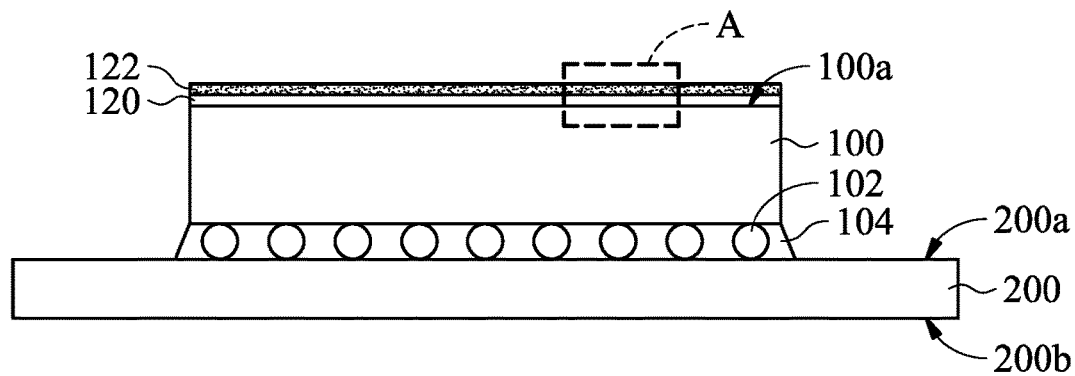

After the semiconductor die 100 is mounted onto the substrate 200, a bonding layer 122 is formed over an upper surface 100a (which is sometimes referred to as a non-active surface) of the semiconductor die 100, as shown in FIG. 1B in accordance with some embodiments. In some embodiments, the bonding layer 122 has good thermal conductivity (e.g., from about 40 W/mK to about 50 W/mK or more). In some embodiments, the bonding layer 122 is made of a solder paste, a silver paste, an indium paste, or a nano-metal ink. In some other embodiments, the bonding layer 122 is a flux layer.

Figure 2:
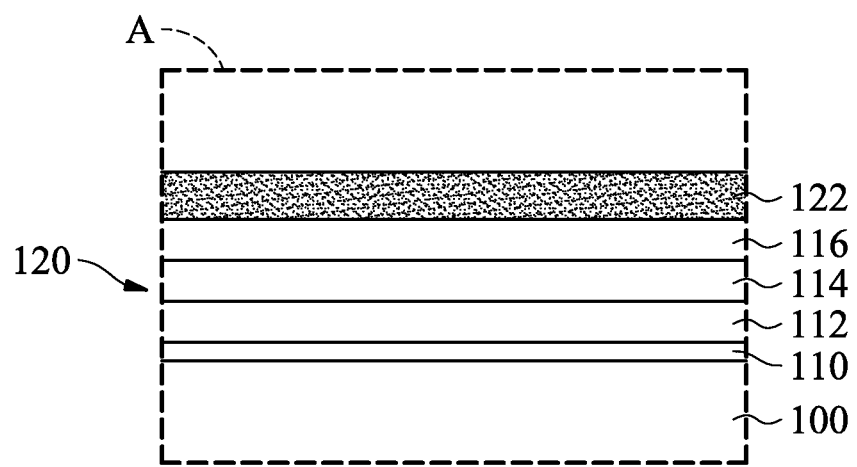
FIG. 2 is an enlarged cross-sectional representation of the region A in FIG. 1B.

In some embodiments, to facilitate adhesion between the bonding layer 122 and the semiconductor die 100, the upper surface 100a of the semiconductor die 100 is deposited by a metallization stack 120 prior to formation of the bonding layer 122. The metallization stack 120 includes an adhesion layer that readily adheres to the semiconductor die 100, wetting layers that readily wet the bonding layer, and a protective layer that prevents an intermetallic compound (IMC) layer from being formed quickly due to the reaction between the wetting layers. The structure of the metallization stack 120 is shown in detail in FIG. 2, which is an enlarged cross-sectional representation of region A in FIG. 1B. In some embodiments, the structure of the metallization stack 120 includes a titanium layer 110, a copper layer 112 formed over the titanium layer 110, a nickel layer 114 formed over the copper layer 112, and an alloy layer 116 of tin and silver (Sn/Ag alloy layer) formed over the nickel layer 114. The titanium layer 110 may act as an adhesion layer for the metallization stack 120. The copper layer 112 and the Sn/Ag alloy layer 116 may act as wetting layers for the metallization stack 120. The nickel layer 114 may act as a protective layer for the metallization stack 120. In some embodiments, the metallization stack 120 is formed by a deposition process, such as a plating process, an evaporation process, a sputtering process, a chemical vapor deposition (CVD) process, or another suitable deposition process.

Figure 1C:
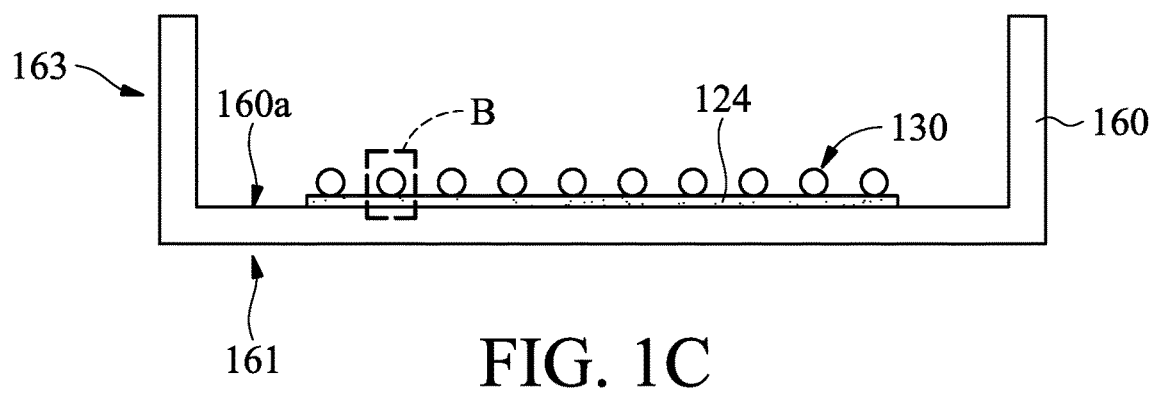

A heat-dissipating feature 160 is provided, as shown in FIG. 1C in accordance with some embodiments. In some embodiments, the heat-dissipating feature 160 is a heat spreader lid and includes a plate portion 161 and a wall portion 163 vertically extending from the edge of the plate portion 161. In some other embodiments, the heat-dissipating feature 160 includes the plate portion 161 and does not have a wall portion 163. In some embodiments, the heat-dissipating feature 160 has a high thermal conductivity, for example, between about 100 W/mK to about 500 W/mK or more, and may be made of a metal, a metal alloy, or the like. For example, the heat-dissipating feature 160 may include metals and/or metal alloys such as aluminum (Al), copper (Cu), nickel (Ni), cobalt (Co), combinations thereof, and the like. The heat-dissipating feature 160 may also be formed of a composite material, for example silicon carbide, aluminum nitride, graphite, and the like.

Afterwards, an inner surface 160a of the plate portion 161 of the heat-dissipating feature 160 is coated with a bonding layer 124. In some embodiments, the bonding layer 124 also has good thermal conductivity (e.g., from about 40 W/mK to about 50 W/mK or more). In some embodiments, the bonding layer 124 is made of a solder paste, a silver paste, an indium paste, or a nano-metal ink. In some other embodiments, the bonding layer 124 is a flux layer. In some embodiments, the bonding layer 124 is made of a material that is different from the material of the bonding layer 122. For example, the bonding layer 124 is made of a solder paste, and the bonding layer 122 is made of flux. Alternatively, the bonding layer 122 is made of a solder paste, and the bonding layer 124 is made of flux.

After the bonding layer 124 is formed on the inner surface 160a of the plate portion 161 of the heat-dissipating feature 160, core-shell structures 130 is placed on the bonding layer 124, as shown in FIG. 1C in accordance with some embodiments. In some embodiments, each of the core-shell structures 130 includes a polymer particle (which is also referred to as a polymer core) and a metal cover (which is also referred to as a metal shell) surrounding or sealing the polymer particle.

Figure 3:
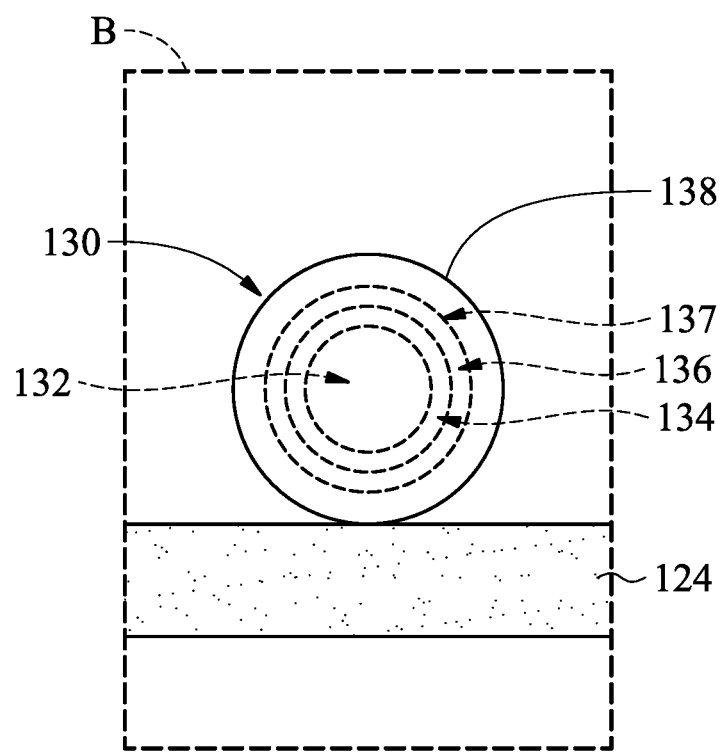
FIG. 3 is an enlarged cross-sectional representation of the region B in FIG. 1C.

As shown in FIG. 3, which is an enlarged cross-sectional representation of the region B in FIG. 1C to show the core-shell structures 130 in detail. In some embodiments, each of the core-shell structures 130 includes a polymer particle (or polymer core) 132 and a metal cover (or metal shell) 137 surrounding the polymer particle 132.

In some embodiments, the polymer particle 132 is made of polystyrene (PS) or polymethyl methacrylate (PMMA), or the like. In some embodiments, the metal cover 137 includes a first layer 134 surrounding or sealing the polymer particle 132, and a second layer 136 surrounding or sealing the first layer 134. In some embodiments, the first layer 134 is made of a metal material that is different from the material of the second layer 136. In some embodiments, the metal cover 137 is formed by a plating process using the first layer 134 as a seed layer. In those cases, the first layer is made of nickel, and the second layer 136 is made of copper (Cu), silver (Ag), gold (Au) or the like.

In some embodiments, each of the core-shell structures 130 also includes an optional solder material layer (such as a Sn/Ag solder layer) 138 surrounding or sealing the metal cover 137 and an intermetallic compound (IMC) layer (not shown) formed between the solder material layer 138 and the metal cover 137. In some embodiments, the IMC layer includes $Cu_6Sn_5$, $Cu_3Sn$, $AuSn_4$, $Ag_3Sn$ or the like and is formed during a heating process or a bonding process. In some other embodiments, when the bonding layer 124 is made of a solder paste, a silver paste, an indium paste, or a nano-metal ink, the core-shell structure 130 does not have a solder material layer 138.

After the core-shell structures 130 are placed on the bonding layer 124, a reflow process is performed in accordance with some embodiments, so that those core-shell structures 130 are mounted over the inner surface 160a of the plate portion 161 of the heat-dissipating feature 160. Although the core-shell structures 130 are mounted over the heat-dissipating feature 160, as shown in FIG. 1C, those core-shell structures 130 can be mounted over the metallization stack 120 through the bonding layer 122 in accordance with some other embodiments.

In some embodiments, those core-shell structures 130 are regularly and/or uniformly arranged on the bonding layer 124 or the bonding layer 122. In some other embodiments, those core-shell structures 130 are irregularly arranged on the bonding layer 124 or the bonding layer 122.

Figure 1D:
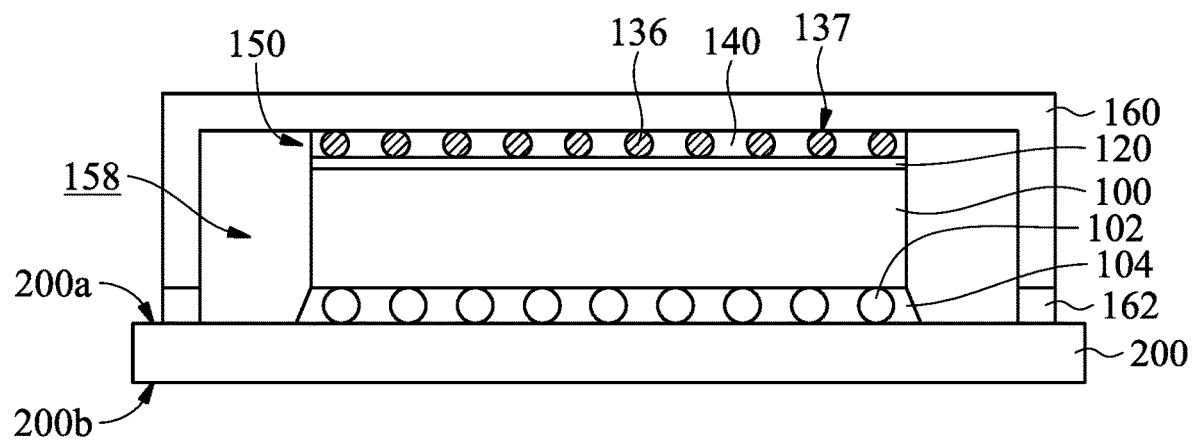

After the formation of the core-shell structures 130, the heat-dissipating feature 160 with the bonding layer 124 and the core-shell structures 130 is bonded to the substrate 200 and the semiconductor die 100, as shown in FIG. 1D in accordance with some embodiments. In some embodiments, the inner surface 160a (as indicated in FIG. 1C) of the heat-dissipating feature 160 faces the bonding layer 122 over the semiconductor die 200 after the heat-dissipating feature 160 is attached to the surface 200a of the substrate 200.

In some embodiments, an adhesive layer 162 is formed on the surface 200a of the substrate 200 and around the perimeter of the substrate 200 before the attachment of the heat-dissipating feature 160 to substrate 200. In some embodiments, the adhesive layer 162 may have a better adhering ability, so as to allow an end of the wall portion 163 (as indicated in FIG. 1C) of the heat-dissipating feature 160 to be attached around the semiconductor die 100 and the perimeter of the substrate 200. For example, the adhesive layer 162 may be made of epoxy, silicon resin, or the like.

In some embodiments, during or after the attachment of the heat-dissipating feature 160 to substrate 200, a thermal process, such as a thermal compression bonding (TCB) process, is performed at a temperature, for example, in a range from about 220° C. to about 250° C., so that the heat-dissipating feature 160 is thermally bonded to the semiconductor die 100 via the bonding layers 122 and 124. During the thermal process, the bonding layers 122 and 124 and the solder material layer 138 (if presented) of each core-shell structure 130 are reflowed, so as to be combined or merged with each other. As a result, a metal-containing matrix material layer 140 is formed of the bonding layers 122 and 124 and the solder material layer 138 (if presented), and each of the core-shell structure 130 including the metal cover 137 and the polymer particle 132 (not shown and as indicated in FIG. 3) is embedded in the metal-containing matrix material layer 140. Therefore, the metal-containing matrix material layer 140 with the core-shell structures 130 create a composite thermal interface material (TIM) structure 150, and the composite TIM structure 150 is thermally connected between the heat-dissipating feature 160 and the semiconductor die 100. After the heat-dissipating feature 160 is bonded to the substrate 200 and the semiconductor die 100 through the adhesive layer 162 and the composite TIM structure 150, respectively, a cavity 158 is formed between the heat-dissipating feature 160 and the substrate 200, and the semiconductor die 100 and the composite TIM structure 150 are within the cavity 158.

In some embodiments, the upper surface 100a (as indicated in FIG. 1B) of the semiconductor die 100 has a first region (not shown) and a second region (not shown) outside of the first region. A density of the core-shell structures 130 corresponding to the first region is different from that of the core-shell structures 130 corresponding to the second region. For example, the first region includes one or more hot spot regions and the second region is a region outside of the first region. Moreover, the density of the core-shell structures 130 corresponding to the first region is greater than that of the core-shell structures 130 corresponding to the second region. The core-shell structures 130 include Cu, Ag, or Au, so that the heat from the hot spot region can be effectively transferred to the heat-dissipating feature 160 by increasing the density of the core-shell structures 130 corresponding to this region.

Figure 1E:
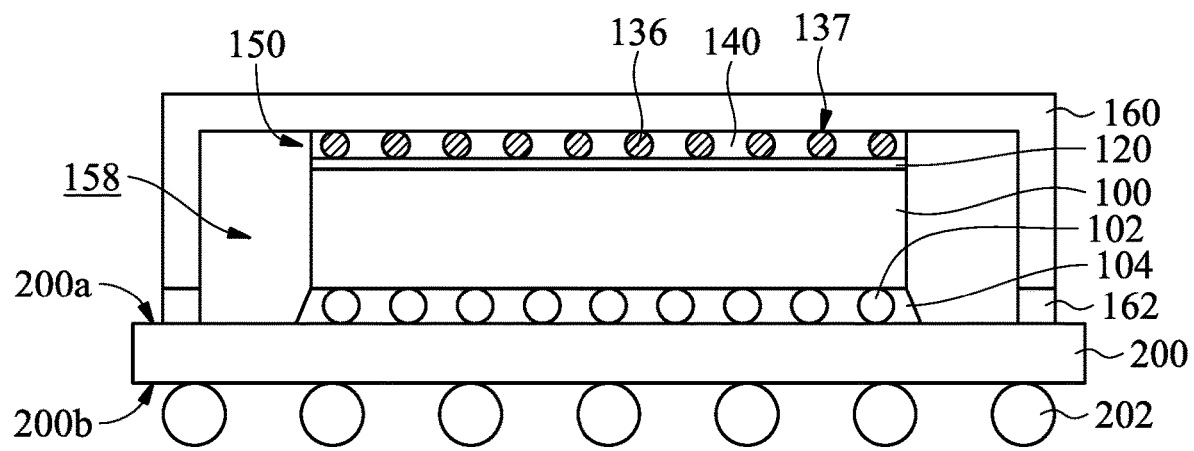

After the attachment of the heat-dissipating feature 160 to substrate 200, conductive connectors 202 are formed on the surface 200b of the substrate, as shown in FIG. 1E in accordance with some embodiments. In some embodiments, the conductive connectors 202 include metal bumps, solder balls, or the like and are arranged to form a ball grid array (BGA). The conductive connectors 202 may be used to electrically connect a motherboard (not shown) or other electrical device components.

Although the conductive connectors 202 are formed on the surface 200b of the substrate 200 after the attachment of the heat-dissipating feature 160 to substrate 200, the conductive connectors 202 may be formed on the substrate 200 before the semiconductor die 100 is mounted onto the upper surface 200a of the substrate 200.

In some other embodiments, after the attachment of the heat-dissipating feature 160 to substrate 200, an encapsulating material (not shown), such as a molding compound, is provided over the structure shown in FIG. 1D. The encapsulating material has a first portion formed in the cavity 158, and a second portion separated from the first portion by the heat-dissipating feature 160. For example, the first portion of the encapsulating material may be covered by the heat-dissipating feature 160, and the semiconductor die 100 is surrounded by the first portion of the encapsulating material.

Moreover, the second portion of the encapsulating material surrounds an exterior sidewall of the heat-dissipating feature 160 and exposes a portion of the heat-dissipating feature 160 that is above the semiconductor die 100. Alternatively, the formed encapsulating material is covered by a heat-dissipating feature 160 without surrounding the exterior sidewall of the heat-dissipating feature 160. In some embodiments, the molding compound is made of an epoxy, a resin, or the like.

In some other embodiments, before the attachment of the heat-dissipating feature 160 to substrate 200, the encapsulating material (not shown) is provided over the structure shown in FIG. 1B. Afterwards, the encapsulating material may be grinded to expose the metallization stack 120. In the semiconductor package shown in FIG. 1E, the metal-containing matrix material layer 140 of the composite TIM structure 150 is formed of the bonding layers 122 and 124 (as indicated in FIGS. 1B and 1C, respectively) that provide good thermal conductivity for transferring the heat generated by the semiconductor die 100 to the heat-dissipating feature 160. As a result, heat dissipation from the semiconductor package structure is improved.

Moreover, in the metal-containing matrix material layer 140, the polymer particles 132 can serve as a stress buffer for the semiconductor die 100, so as to eliminate or reduce the thermal mechanical stress generated by the thermal process (e.g., the TCB process). Therefore, the formation of cracks in the semiconductor die 100 during the thermal process can be prevented or mitigated. As a result, the reliability of the semiconductor package is increased.

In addition, each of the polymer particles 132 coated with the metal cover 137 can serve as a spacer, so as to provide a mechanical support for the composite TIM structure 150. Therefore, the height or thickness of the composite TIM structure 150 can be controlled by adjusting the size (e.g., diameter) of the metal cover 137. Moreover, the composite TIM structure 150 can achieve a uniform thickness after the thermal process, thereby reducing the thermal resistance between the semiconductor die 100 and the heat-dissipating feature 160. As a result, the heat dissipation for the semiconductor package structure is improved further.

Many variations and/or modifications can be made to embodiments of the disclosure. For example, FIG. 1B shows that the bonding layer 122 over the metallization stack 120 is a continuous layer, but embodiments of the disclosure are not limited. The bonding layer over the metallization stack 120 may be a patterned or discontinuous layer. FIGS. 4A to 4F show cross-sectional representations of various stages of forming a semiconductor package, in accordance with some embodiments. The stages shown in FIGS. 4A to 4F are similar to those shown in FIGS. 1A to 1E. In some embodiments, the materials, formation methods, and/or benefits of the semiconductor package shown in FIGS. 1A to 1E can also be applied in the embodiments illustrated in FIGS. 4A to 4F, and are therefore not repeated.

Figure 4A:
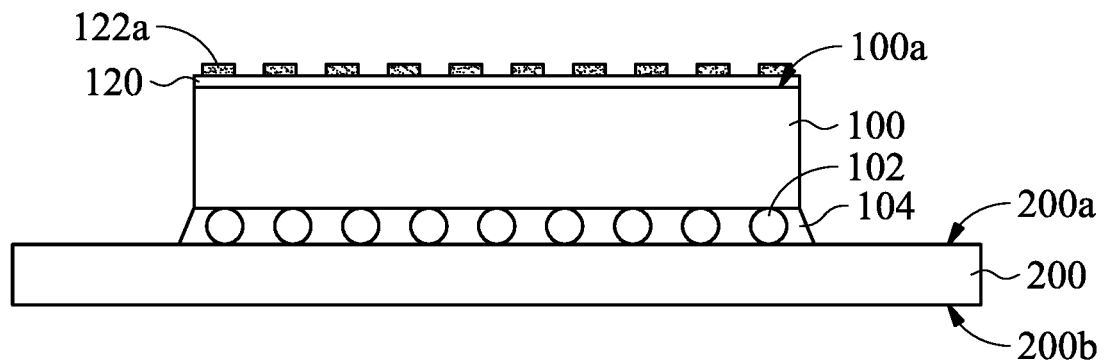
FIGS. 4A to 4F show cross-sectional representations of various stages of forming a semiconductor package, in accordance with some embodiments.

A structure similar to FIG. 1B is provided, as shown in FIG. 4A in accordance with some embodiments. Unlike the structure shown in FIG. 1B, a patterned or discontinuous bonding layer 122a is formed over the metallization stack 120. In some embodiments, the bonding layer 122a is made of a material that is the same or similar to the material of the bonding layer 122 shown in FIG. 1B. In some embodiments, the bonding layer 122a includes island portions that are regularly and/or uniformly arranged over the metallization stack 120. In some other embodiments, those island portions are irregularly arranged over the metallization stack 120. In some embodiments, the bonding layer 122a is made of solder paste.

Figure 4B:
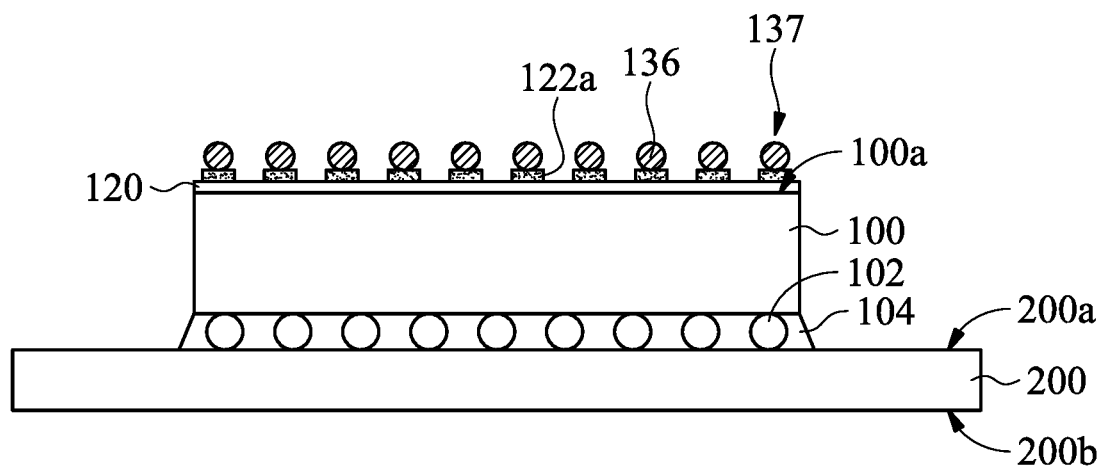

After the bonding layer 122a is formed, core-shell structures are placed on the island portions of the bonding layer 122a, respectively, as shown in FIG. 4B in accordance with some embodiments. Similar to the core-shell structures 130 shown in FIG. 3, each of the core-shell structure includes a polymer particle (or polymer core) 132 (not shown and as indicated in FIG. 3) and a metal cover (or metal shell) 137 surrounding or sealing the polymer particle 132. In some embodiments, the core-shell structure includes an optional solder material layer (such as a Sn/Ag solder layer) 138 (not shown and as indicated in FIG. 3) surrounding or sealing the metal cover 137 and an intermetallic compound (IMC) layer (not shown) formed between the solder material layer 138 and the metal cover 137. The IMC layer may be formed during a heating process or a bonding process. In some other embodiments, two or more the core-shell structures are placed on at least one of the island portions of the bonding layer 122a.

Figure 4C:
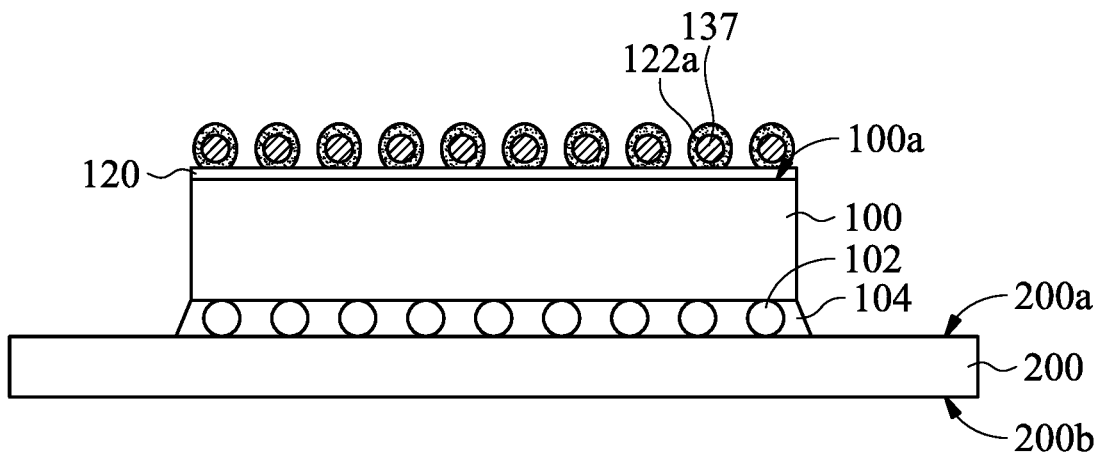

In some embodiments, after the placement of the core-shell structures, a reflow process is performed on the bonding layer 122a that is made of a solder paste, so that the core-shell structures are coated with the bonding layer 122a, as shown in FIG. 4C in accordance with some embodiments. In some embodiments, after the reflow process is performed, the island portions of the bonding layer 122a surround or seal the respective metal covers 137 (i.e., core-shell structure). As a result, each of the metal covers 137 having a polymer particle therein and covered by the respective island portion of the bonding layer 122a is mounted over the metal stack 120.

In some other embodiments, the bonding layer 122a is made of flux, and core-shell structures are placed on the island portions of the bonding layer 122a, respectively. In those cases, each of the core-shell structure is formed by successively covering a polymer particle 132 (not shown and as indicated in FIG. 3) with a metal cover 137 and a bonding layer (not shown), such as a solder paste layer. Moreover, an IMC layer (not shown) is formed between the bonding layer (e.g., the solder paste layer) and the metal cover 137. After the placement of the core-shell structures, a reflow process is performed on the core-shell structures including the solder paste layer, so that each of the metal covers 137 having a polymer particle therein and covered by the respective solder paste layer is mounted over the metal stack 120.

Figure 4D:
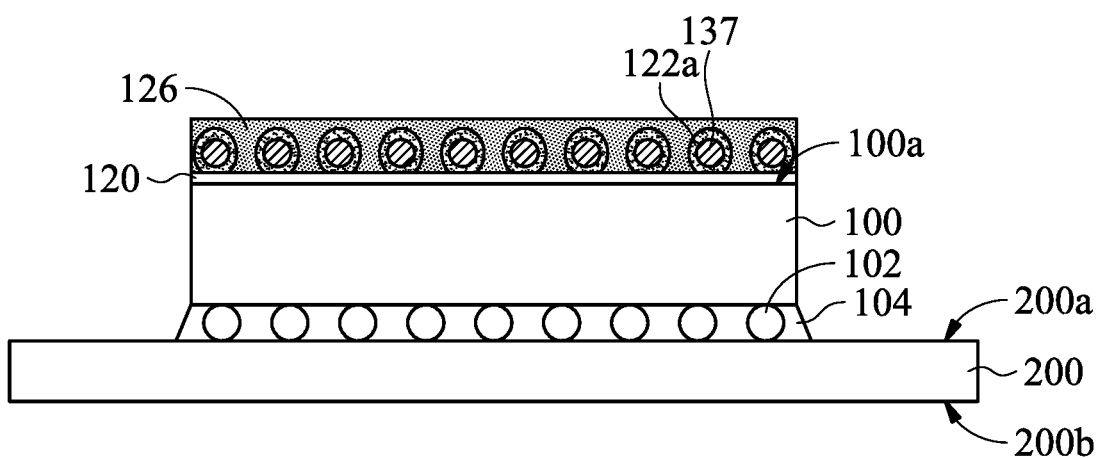

After the metal covers 137 are mounted over the metal stack 120, an optional bonding layer 126 is formed over the metallization stack 120 to cover the bonding layers 122a or the solder paste layers that surround the corresponding metal covers 137, as shown in FIG. 4D in accordance with some embodiments. In some embodiments, the bonding layer 126 has good thermal conductivity (e.g., between about 40 W/mK and about 50 W/mK or more) and is made of a material that is the same as that of the bonding layers 122a. In some embodiments, the bonding layer 126 is made of a solder paste, a silver paste, or an indium paste.

Figure 4E:
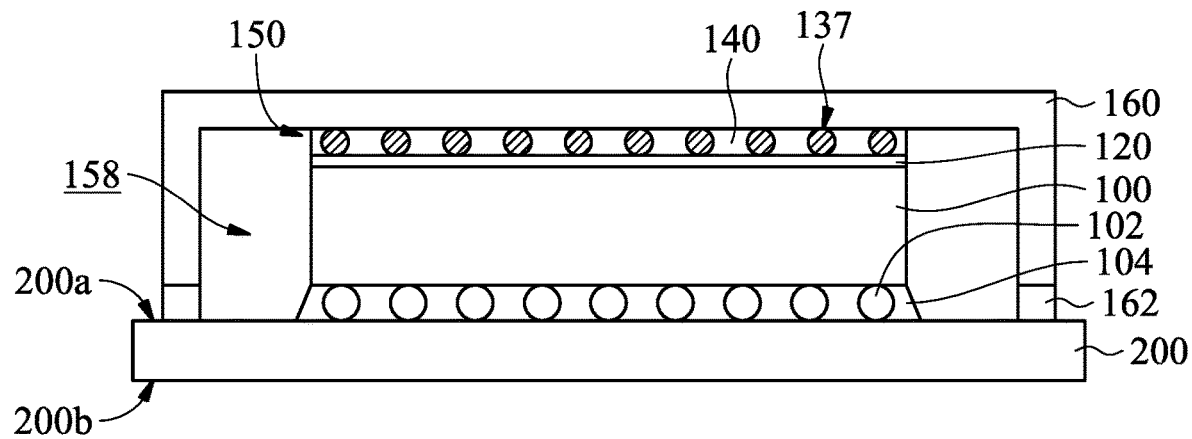

Afterwards, a heat-dissipating feature 160 with an optional bonding layer 124 (not shown and as indicated in FIG. 1C) is bonded to the substrate 200 and the semiconductor die 100, as shown in FIG. 4E in accordance with some embodiments. In some embodiments, the method for bonding the heat-dissipating feature 160 is the same as or similar to the method described in FIG. 1D.

As a result, a metal-containing matrix material layer 140 is formed of the bonding layer 122a and the bonding layers 124 and 126 (if presented) and the solder material layer 138 (if presented). Moreover, each of the core-shell structure including the metal cover 137 and the polymer particle 132 (not shown and as indicated in FIG. 3) is embedded in the metal-containing matrix material layer 140 to create a composite TIM structure 150, so that the composite TIM structure 150 is thermally connected between the heat-dissipating feature 160 and the semiconductor die 100. A cavity 158 is formed between the heat-dissipating feature 160 and the substrate 200, and the semiconductor die 100 and the composite TIM structure 150 are within the cavity 158.

Figure 5:
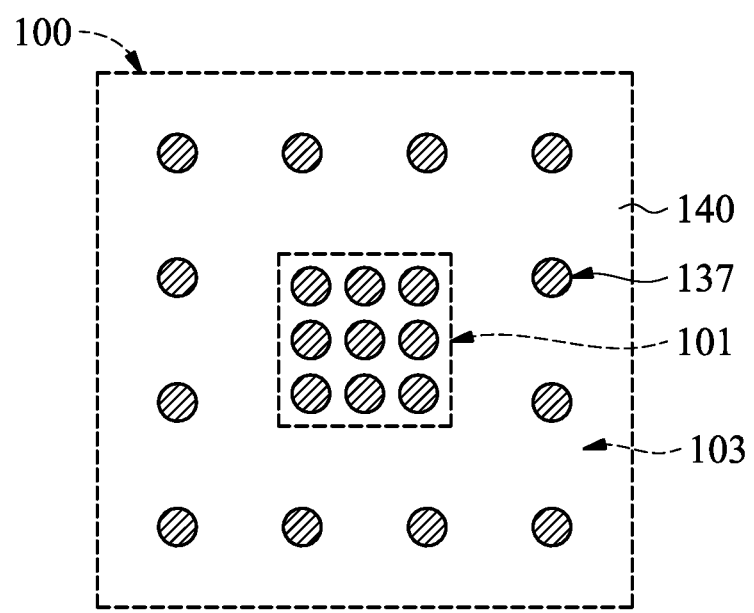
FIG. 5 is a plane view showing an arrangement of the core-shell structures in the composite thermal interface material (TIM) structure, in accordance with some embodiments.

The upper surface of the semiconductor die 100 below the composite TIM structure 150 has one or more than one hot spot regions (e.g., a hot spot region 101) and a region 103 outside of the hot spot region 101, as shown in FIG. 5 in accordance with some embodiments. In some embodiments, a density of the core-shell structures (e.g., the metal covers 137) corresponding to the hot spot region 101 is greater than that of the core-shell structures corresponding to the region 103 outside of the hot spot region 101, so that the heat from the hot spot region 101 can be effectively transferred to the heat-dissipating feature 160 by increasing the density of the core-shell structures corresponding to the hot spot region 101.

Figure 4F:
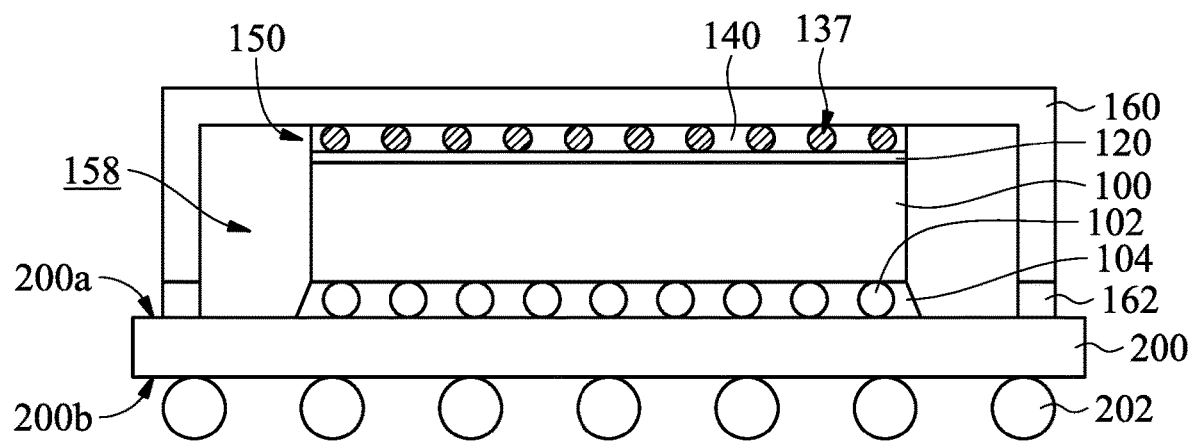

After the attachment of the heat-dissipating feature 160 to substrate 200, conductive connectors 202 are formed on the surface 200b of the substrate, as shown in FIG. 4F in accordance with some embodiments.

In some other embodiments, the conductive connectors 202 may be formed on the substrate 200 before the semiconductor die 100 is mounted onto the upper surface 200a of the substrate 200. In some other embodiments, after the attachment of the heat-dissipating feature 160 to substrate 200, an encapsulating material (not shown), such as a molding compound, is provided over the structure shown in FIG. 4E in a manner that is the same as or similar to the manner of providing the encapsulating material (not shown) over the structure shown in FIG. 1D. In some embodiments, the encapsulating material (e.g., molding compound) covers over and surrounds the semiconductor die 100.

Figure 6:
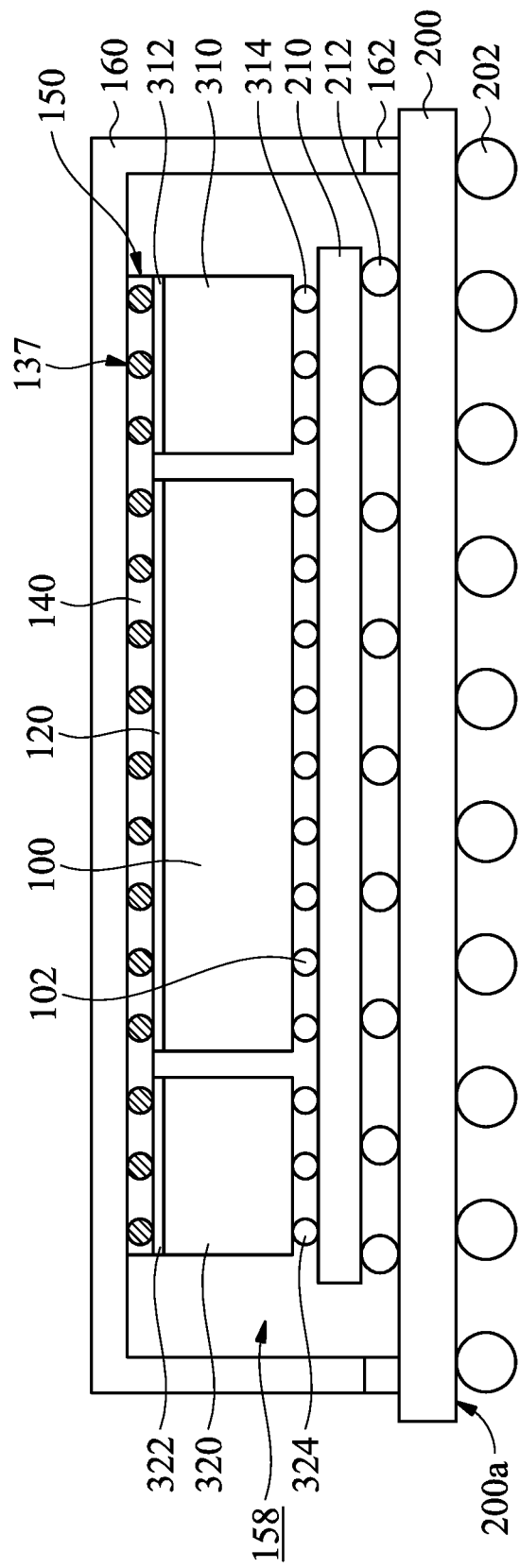
FIG. 6 shows a cross-sectional representation of a semiconductor package, in accordance with some embodiments.

Many variations and/or modifications can be made to embodiments of the disclosure. For example, FIG. 1E or 4F shows that a semiconductor die 100 mounted onto the substrate 200 and covered by the composite TIM structure 150, but embodiments of the disclosure are not limited. The composite TIM structure 150 may cover more than one semiconductor die and may be mounted over another package component that is different from the substrate 200. FIG. 6 shows a cross-sectional representation of a semiconductor package, in accordance with some embodiments. The package structure shown in FIG. 6 is similar to the package structure shown in FIG. 1E or 4F. In some embodiments, the materials, formation methods, and/or benefits of the semiconductor package shown in FIG. 1E or 4F can also be applied in the embodiments illustrated in FIG. 6, and are therefore not repeated.

Unlike the semiconductor package shown in FIG. 1E or 4F, the semiconductor package shown in FIG. 6 further includes a package component (such as an interposer 210) between a substrate 200 (such a package substrate) and a semiconductor die 100, in accordance with some embodiments. In some embodiments, the semiconductor package shown in FIG. 6 further includes one or more semiconductor dies mounted onto an interposer 210 as well as the semiconductor die 100, and have a side-by-side configuration.

For example, the semiconductor dies 100, 310 and 320 may have conductive connectors 102, 314 and 316, respectively, and those conductive connectors 102, 314 and 316 are mounted over the interposer 210. The materials, the sizes and the pitches of the conductive connectors 314 and 316 may be the same as or similar to those of the conductive connectors 102. The semiconductor dies 310 and 320 may be arranged on opposite sides of the semiconductor die 100, so that those semiconductor dies 100, 310 and 320 are arranged side-by-side.

In some embodiments, the semiconductor die 100 is a SoC die and semiconductor dies 310 and 320 are memory dies, such as high bandwidth memory (HBM) dies.

In some embodiments, a combination of an insulating layer (not shown) with patterned conductive layers (not shown) form an RDL structure (or fan-out structure) in the interposer 210, so that the interposer 210 electrically connects those semiconductor dies 100, 310 and 320 via such a RDL structure. In some embodiments, the interposer 210 has conductive connects 212 and the conductive connectors 212 are mounted over the substrate 200 and electrically connected to the substrate via a RDL structure (not shown) in the substrate 200. The material of the conductive connect 212 may be the same as or similar to that of the conductive connector 102. In some embodiments, the sizes and pitches of the conductive connects 212 are greater than those of the conductive connects 102.

In some embodiments, the semiconductor dies 310 and 320 respectively have metallization stacks 312 and 322 that are thermally connected to the composite TIM structure 150. As a result, the semiconductor dies 100, 310 and 320 are between the composite TIM structure 150 and the interposer 210 and within a cavity 158 that is formed between the heat-dissipating feature 160 and the substrate 200. In some embodiments, the materials and the structures of the metallization stacks 312 and 322 are the same as or similar to those of the metallization stack 120 of the semiconductor die 100.

Figure 7:
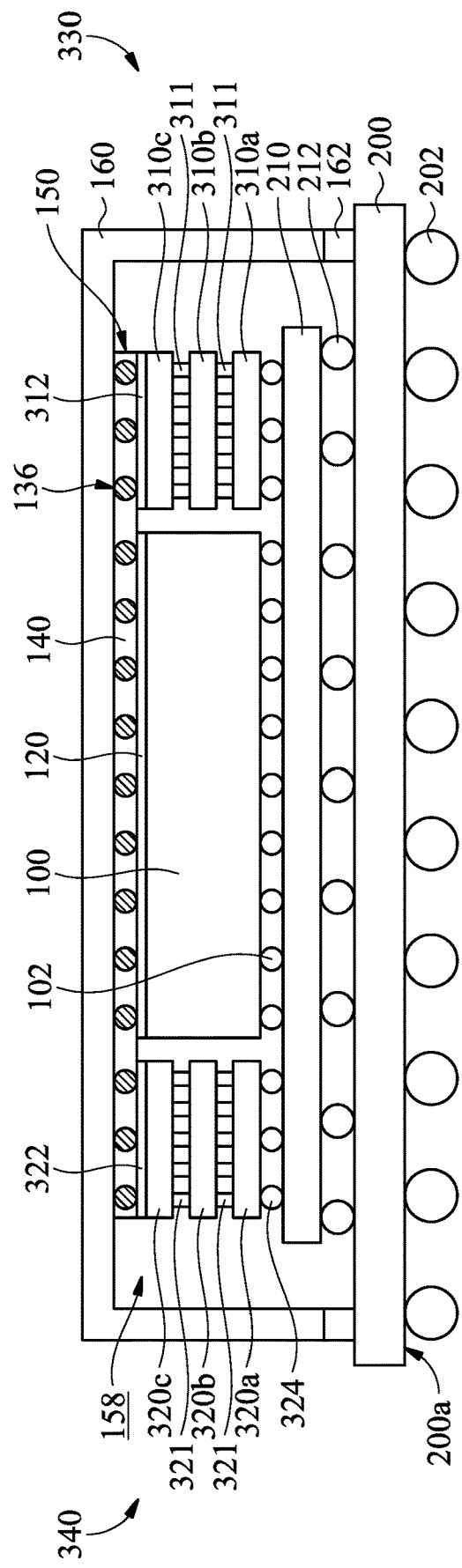
FIG. 7 shows a cross-sectional representation of a semiconductor package, in accordance with some embodiments.

Many variations and/or modifications can be made to embodiments of the disclosure. For example, FIG. 6 shows that semiconductor dies 310 and 320 are arranged on opposite sides of the semiconductor die 100, but embodiments of the disclosure are not limited. Semiconductor die stacks may be arranged on opposite sides of the semiconductor die 100, so that the semiconductor die stacks and the semiconductor die 100 have a side-by-side configuration. FIG. 7 shows a cross-sectional representation of a semiconductor package, in accordance with some embodiments. The package structure shown in FIG. 7 is similar to the package structure shown in FIG. 6. In some embodiments, the materials, formation methods, and/or benefits of the semiconductor package shown in FIG. 6 can also be applied in the embodiments illustrated in FIG. 7, and are therefore not repeated.

Unlike the semiconductor package shown in FIG. 6, the semiconductor package shown in FIG. 7 further includes semiconductor die stacks 330 and 340 arranged on opposite sides of the semiconductor die 100, so that the semiconductor die stacks and the semiconductor die 100 have a side-by-side configuration, in accordance with some embodiments. For example, the semiconductor die stack 330 includes semiconductor dies 310a, 310b and 310c successively stacked and mounted over an interposer 210 via conductive connectors 314, and electrically connected to each other via conductive connectors 311, which may be microbumps. Moreover, the uppermost semiconductor die of the semiconductor die stack 330 (e.g., semiconductor die 310c) has the metallization stack 312 thermally connected to a composite TIM structure 150.

Similarly, the semiconductor die stack 340 includes semiconductor dies 320a, 320b and 320c successively stacked and mounted over an interposer 210 via conductive connectors 324, and electrically connected to each other via conductive connectors 321, which may be microbumps. Moreover, the uppermost semiconductor die of the semiconductor die stack 340 (e.g., semiconductor die 320c) has the metallization stack 322 thermally connected to the composite TIM structure 150.

In some embodiments, those semiconductor dies 310a, 310b, 310c 320a, 320b, and 320c are memory dies, such as HBM dies.

Embodiments of a semiconductor package and a method for forming the same are provided. The semiconductor package includes a composite thermal interface material (TIM) structure 150 that is thermally bonded between a semiconductor die 100 and a heat-dissipating feature 160. The formation of the composite TIM structure 150 includes forming a metallization stack 120 over the semiconductor die 100. Afterwards, each of polymer particles 132 that is coated with a metal cover 137 and embedded in a metal-containing matrix material layer 140 is mounted over the metallization stack 120. The metal-containing matrix material layer 140 provides good thermal conductivity for transferring the heat generated by the semiconductor die to the heat-dissipating feature. The polymer particle 132 coated with the metal cover 137 provides a stress buffer for the semiconductor die 100, so as to prevent or mitigate the formation of cracks in the semiconductor die 100 during the thermal process. The polymer particle 132 coated with the metal cover 137 also provides mechanical support for the composite TIM structure 150, so that the composite TIM structure 150 can achieve a uniform thickness after the thermal process, so as to reduce the thermal resistance between the semiconductor die 100 and the heat-dissipating feature 160. As a result, the heat dissipation for the semiconductor package is improved and the reliability of the semiconductor package is increased.

Embodiments of a semiconductor package and a method for forming the same are provided. The semiconductor package includes a composite thermal interface material (TIM) structure between a semiconductor die and a heat-dissipating feature. The formation of the composite TIM structure includes forming a metal-containing matrix material layer over the semiconductor and forming polymer particles in the metal-containing matrix material layer. The metal-containing matrix material layer provides good thermal conductivity for transferring the heat generated by the semiconductor die to the heat-dissipating feature. The polymer particle provides a stress buffer for the semiconductor die, so as to prevent or mitigate the formation of cracks in the semiconductor die during the thermal process. As a result, the heat dissipation for the semiconductor package is improved and the reliability of the semiconductor package is increased.

In some embodiments, a semiconductor package is provided. The semiconductor package includes a substrate and a semiconductor die over the substrate. The semiconductor package also includes a heat-dissipating feature over the substrate and covering the semiconductor die, and a composite thermal interface material (TIM) structure thermally bonded between the semiconductor die and the heat-dissipating feature. The composite TIM structure includes a metal-containing matrix material layer and polymer particles embedded in the metal-containing matrix material layer.

In some embodiments, a semiconductor package is provided. The semiconductor package includes a heat spreader lid and a first semiconductor die having an upper surface covered by the heat spreader lid. The upper surface of the first semiconductor die has at least one hot spot region and a region outside of the hot spot region. The semiconductor package also includes a bonding layer thermally connected between the first semiconductor die and the heat spreader lid, and core-shell structures formed in the bonding layer. Each of the core-shell structures includes a polymer core and a metal shell. The density of the core-shell structures above the hot spot region is greater than the density of the core-shell structures above the region outside of the hot spot region.

In some embodiments, a method of forming a semiconductor package is provided. The method includes forming a metallization stack over a semiconductor die. The method also includes mounting polymer particles over the metallization stack. Each of the polymer particles is coated with a first bonding layer. The method also includes bonding a heat spreader lid with the semiconductor die by reflowing the first bonding layer. A composite thermal interface material (TIM) structure is formed between the heat spreader lid and the semiconductor die during the bonding. The composite TIM structure includes the first bonding layer and the polymer particles embedded in the first bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate;
   a semiconductor die over the substrate;
   a heat-dissipating feature over the substrate and covering the semiconductor die; and
   a composite thermal interface material (TIM) structure thermally bonded between the semiconductor die and the heat-dissipating feature, comprising:
      a metal-containing matrix material layer;
      a plurality of polymer particles embedded in the metal-containing matrix material layer; and
      a plurality of metal covers respectively surrounding the plurality of polymer particles, wherein each of the plurality of metal covers comprises a first layer and a second layer surrounding the first layer, and each of the plurality of metal covers is surrounded by a solder material layer.

2. The semiconductor package as claimed in claim 1, wherein the first layer is made of a metal material that is different from a material of the second layer.

3. The semiconductor package as claimed in claim 2, wherein the second layer is made of copper, silver, or gold.

4. The semiconductor package as claimed in claim 1, wherein the metal-containing matrix material layer is made of a solder paste, a silver paste, an indium paste, or a nano-metal ink, and each of the plurality of polymer particles is made of polystyrene or polymethyl methacrylate.

5. The semiconductor package as claimed in claim 1, further comprising a metallization stack formed between the semiconductor die and the composite TIM structure, wherein the metallization stack comprises a titanium layer, a copper layer, a nickel layer, and an alloy layer of tin and silver.

6. The semiconductor package as claimed in claim 1, wherein the semiconductor die has a first region and a second region, and a density of the plurality of polymer particles corresponding to the first region is different from that of the plurality of polymer particles corresponding to the second region.

7. The semiconductor package as claimed in claim 1, wherein the heat-dissipating feature is bonded to the substrate to create a cavity between the heat-dissipating feature and the substrate, and wherein the semiconductor die and the composite TIM structure are within the cavity.

8. The semiconductor package as claimed in claim 2, wherein the first layer is made of nickel.

9. A semiconductor package, comprising:
a heat spreader lid;
a first semiconductor die having an upper surface covered by the heat spreader lid, wherein the upper surface of the first semiconductor die has at least one hot spot region and a region outside of the hot spot region;
a bonding layer thermally connected between the first semiconductor die and the heat spreader lid; and
a plurality of core-shell structures formed in the bonding layer, wherein each of the plurality of core-shell structures comprises a polymer core and a metal shell,
wherein a density of the plurality of core-shell structures above the hot spot region is greater than the density of the plurality of core-shell structures above the region outside of the hot spot region, and
wherein the metal shell of each of the plurality of core-shell structures comprises a first layer and a second layer surrounding the first layer, and the metal shell of each of the plurality of core-shell structures is surrounded by a solder material layer.

10. The semiconductor package as claimed in claim 9, further comprising a second semiconductor die having an upper surface covered by the heat spreader lid, so that the first and second semiconductor dies have a side-by-side configuration.

11. The semiconductor package as claimed in claim 10, further comprising a third semiconductor die stacked below the second semiconductor die.

12. The semiconductor package as claimed in claim 9, wherein the bonding layer is made of a solder paste, a silver paste, an indium paste, or a nano-metal ink, and the polymer core is made of polystyrene or polymethyl methacrylate.

13. The semiconductor package as claimed in claim 9, wherein the first layer and the second layer are made of different metal materials.

14. The semiconductor package as claimed in claim 9, further comprising a metallization stack formed between the first semiconductor die and the bonding layer.

15. A semiconductor package, comprising:
a substrate;
an interposer formed over and electrically connected to the substrate;
a first semiconductor die and a second semiconductor die formed over and electrically connected to the interposer;
a heat-dissipating feature connected to the substrate and capping the first semiconductor die, the second semiconductor die, and the interposer;
a metal-containing matrix material layer thermally bonded between the first and second semiconductor dies and the heat-dissipating feature; and
a plurality of polymer particles embedded in the metal-containing matrix material layer, wherein the each of the plurality of polymer particles is surrounded by a first metal layer and the first metal layer is surrounded by a second metal layer, and the first metal layer and the second metal layer are surrounded by a solder material layer.

16. The semiconductor package as claimed in claim 15, further comprising a third semiconductor die formed between the first semiconductor die and the second semiconductor die, or stacked below the one of the first semiconductor die and the second semiconductor die.

17. The semiconductor package as claimed in claim 15, further comprising a first metallization stack thermally connected the first semiconductor die to the metal-containing matrix material layer, and a second metallization stack thermally connected the second semiconductor die to the metal-containing matrix material layer.

18. The semiconductor package as claimed in claim 17, wherein each of the first metallization stack and the second metallization stack comprises a titanium layer, a copper layer, a nickel layer, and an alloy layer of tin and silver.

19. The semiconductor package as claimed in claim 15, wherein an upper surface of one of the first semiconductor die and the second semiconductor die has a first region and a second region, and wherein a density of the plurality of polymer particles corresponding to the first region is different than that corresponding to the second region.

20. The semiconductor package as claimed in claim 15, wherein the first layer and the second layer are made of different metal materials.

* * * * *